(12) United States Patent
Cheng et al.

(10) Patent No.: US 12,237,215 B2
(45) Date of Patent: Feb. 25, 2025

(54) SEMICONDUCTOR STRUCTURE AND METHOD FOR MANUFACTURING SAME

(71) Applicant: CHANGXIN MEMORY TECHNOLOGIES, INC., Hefei (CN)

(72) Inventors: Ming Cheng, Hefei (CN); Xing Jin, Hefei (CN); Ran Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 669 days.

(21) Appl. No.: 17/451,456

(22) Filed: Oct. 19, 2021

(65) Prior Publication Data

US 2022/0093449 A1 Mar. 24, 2022

Related U.S. Application Data

(63) Continuation of application No. PCT/CN2021/103851, filed on Jun. 30, 2021.

(30) Foreign Application Priority Data

Sep. 18, 2020 (CN) .......................... 202010988672.3

(51) Int. Cl.
*H01L 23/532* (2006.01)
*H01L 21/768* (2006.01)
*H10B 12/00* (2023.01)

(52) U.S. Cl.
CPC ....... *H01L 21/7682* (2013.01); *H10B 12/315* (2023.02); *H10B 12/482* (2023.02)

(58) Field of Classification Search
CPC .......... H01L 21/7682; H01L 21/76897; H10B 12/315; H10B 12/482; H10B 12/0335
See application file for complete search history.

(56) References Cited

U.S. PATENT DOCUMENTS

| 8,198,189 B2 | 6/2012 | Kim |
| 8,344,517 B2 | 1/2013 | Kim |
| 8,697,525 B2 | 4/2014 | Kim |

(Continued)

FOREIGN PATENT DOCUMENTS

| CN | 1855511 A | 11/2006 |
| CN | 102543944 A | 7/2012 |

(Continued)

OTHER PUBLICATIONS

Non-Final Office Action of the U.S. Appl. No. 17/389,752, issued on Feb. 22, 2024, 81 pages.

(Continued)

*Primary Examiner* — Samuel Park
(74) *Attorney, Agent, or Firm* — Syncoda LLC; Feng Ma

(57) ABSTRACT

A semiconductor structure includes a substrate, bit line structures located on the substrate, capacitor contact holes located on each of two opposite sides of the bit line structure, and isolation side walls, each of the isolation side walls is located between a respective bit line structure and the capacitor contact holes on one side of the bit line structure. A gap isolation layer is provided between the isolation side walls located on two opposite sides of the bit line structure. The gap isolation layer is located on the bit line structure, and a first gap is provided inside the gap isolation layer. A second gap is provided between the isolation side wall and the gap isolation layer.

13 Claims, 9 Drawing Sheets

(56) References Cited

U.S. PATENT DOCUMENTS

| | | |
|---|---|---|
| 8,828,829 B2 | 9/2014 | Joung et al. |
| 8,921,223 B2 | 12/2014 | Lee |
| 8,941,157 B2 | 1/2015 | Kim et al. |
| 9,165,859 B2 | 10/2015 | Lim et al. |
| 9,275,937 B2 | 3/2016 | Lee |
| 9,331,072 B2 | 5/2016 | Seo |
| 9,337,202 B2 | 5/2016 | Lim et al. |
| 9,356,073 B1 | 5/2016 | Kim |
| 9,379,004 B1 | 6/2016 | Kwon et al. |
| 9,419,000 B2 | 8/2016 | Kim |
| 9,576,895 B2 | 2/2017 | Lee |
| 9,786,598 B2 | 10/2017 | Kim et al. |
| 9,911,851 B2 | 3/2018 | Seo |
| 10,043,809 B1 | 8/2018 | Chang et al. |
| 10,411,014 B2 | 9/2019 | Hwang et al. |
| 10,475,794 B1 | 11/2019 | Wu et al. |
| 2005/0012128 A1 | 1/2005 | Bae |
| 2010/0285662 A1 | 11/2010 | Kim |
| 2012/0168899 A1 | 7/2012 | Kim |
| 2012/0217631 A1 | 8/2012 | Kim |
| 2013/0093093 A1 | 4/2013 | Lee |
| 2014/0159194 A1 | 6/2014 | Song et al. |
| 2014/0175659 A1 | 6/2014 | Lee |
| 2014/0179102 A1 | 6/2014 | Joung et al. |
| 2014/0217545 A1 | 8/2014 | Kim et al. |
| 2014/0299989 A1 | 10/2014 | Lim et al. |
| 2014/0367825 A1* | 12/2014 | Kim .................. H01L 29/0649 257/522 |
| 2015/0056801 A1 | 2/2015 | Park et al. |
| 2015/0076693 A1 | 3/2015 | Lee |
| 2015/0214220 A1 | 7/2015 | Seo |
| 2016/0005743 A1 | 1/2016 | Lim et al. |
| 2016/0027727 A1 | 1/2016 | Kim et al. |
| 2016/0133564 A1 | 5/2016 | Lee |
| 2016/0172304 A1 | 6/2016 | Lee et al. |
| 2016/0181143 A1 | 6/2016 | Kwon et al. |
| 2016/0204262 A1 | 7/2016 | Seo |
| 2016/0211215 A1 | 7/2016 | Lee |
| 2016/0225710 A1 | 8/2016 | Hwang |
| 2016/0329337 A1 | 11/2016 | Hwang et al. |
| 2017/0062347 A1 | 3/2017 | Kim |
| 2019/0088739 A1 | 3/2019 | Lee et al. |
| 2021/0217652 A1* | 7/2021 | Nam ............... H01L 21/823475 |
| 2022/0059543 A1 | 2/2022 | Mun et al. |
| 2022/0139924 A1 | 5/2022 | Liao |
| 2023/0056204 A1 | 2/2023 | Chen |

FOREIGN PATENT DOCUMENTS

| | | |
|---|---|---|
| CN | 103903994 A | 7/2014 |
| CN | 105280608 A | 1/2016 |
| CN | 105719998 A | 6/2016 |
| CN | 106941097 A | 7/2017 |
| CN | 110581103 A | 12/2019 |
| CN | 111584489 A | 8/2020 |
| KR | 20190037845 A | 4/2019 |

OTHER PUBLICATIONS

US office action in U.S. Appl. No. 17/446,957, mailed on Aug. 15, 2024.

* cited by examiner

SEMICONDUCTOR STRUCTURE AND METHOD FOR MANUFACTURING SAME

CROSS-REFERENCE TO RELATED APPLICATIONS

This application is a continuation of International Application No. PCT/CN2021/103851 filed on Jun. 30, 2021, which claims priority to Chinese Patent Application No. 202010988672. 3 filed on Sep. 18, 2020. The disclosures of these applications are hereby incorporated by reference in their entirety.

BACKGROUND

With a feature size of a semiconductor integrated circuit continues to decrease, requirements for a manufacturing process of a Dynamic Random-Access Memory (DRAM) process are increasingly higher.

Specifically, with the feature size continues to decrease, a distance between adjacent conductors becomes increasingly smaller, and a thickness of a dielectric layer isolating adjacent conductors becomes increasingly thinner. When a dielectric constant of the dielectric layer is constant, the thinner the thickness of the dielectric layer, the more serious the problem of parasitic capacitance between adjacent conductors.

SUMMARY

The embodiments of the present disclosure relate to the field of semiconductors, and particularly relates to a semiconductor structure and a method for manufacturing same.

According to some embodiments, the present disclosure provides a semiconductor structure, including a substrate, bit line structures located on the substrate, capacitor contact holes located on each of two opposite sides of each the bit line structure, and isolation side walls, each of the isolation side walls is located between a respective bit line structure and the capacitor contact holes on one side of the bit line structure. A gap isolation layer is provided between the isolation side walls located on two opposite sides of the bit line structure. The gap isolation layer is located on the bit line structure, and a first gap is provided inside the gap isolation layer. A second gap is provided between the isolation side wall and the gap isolation layer.

According to some embodiments, the present disclosure further provides a method for manufacturing a semiconductor structure. The method includes the following operations. A substrate and bit line structures located on the substrate are provided, each of the bit line structures includes a top dielectric layer, and is provided with capacitor contact holes on each of two opposite sides of the bit line structure; a sacrificial side wall covering a side wall of the top dielectric layer is formed; at least part of the top dielectric layer is removed to form a first gap; a deposition process is performed to form a gap isolation layer having the first gap; and an isolation side wall covering the sacrificial side wall is formed, and at least part of the sacrificial side wall is removed to form a second gap located between the isolation side wall and the gap isolation layer.

BRIEF DESCRIPTION OF THE DRAWINGS

One or more embodiments are exemplified by the corresponding accompanying drawings. These exemplified descriptions do not constitute a limitation to the embodiments. Elements with the same reference numerals in the accompanying drawings are shown as similar elements. The accompanying drawings do not constitute scaling restrictions unless otherwise stated.

DETAILED DESCRIPTION

In order to make the objectives, the technical solutions and the advantages of the embodiments of the present disclosure clearer, the various embodiments of the present disclosure will be described in detailed below in combination with the accompanying drawings. However, those of ordinary skill in the art can understand that in the various embodiments of the present disclosure, many technical details are provided for the reader to better understand the present disclosure. However, the technical solutions claimed in the present disclosure can also be implemented even without these technical details and various changes and modifications based on the following embodiments.

FIG. 1 to FIG. 18 are schematic structural diagrams corresponding to various steps of a method for manufacturing a semiconductor structure provided in the embodiments of the present disclosure.

Figure 1:
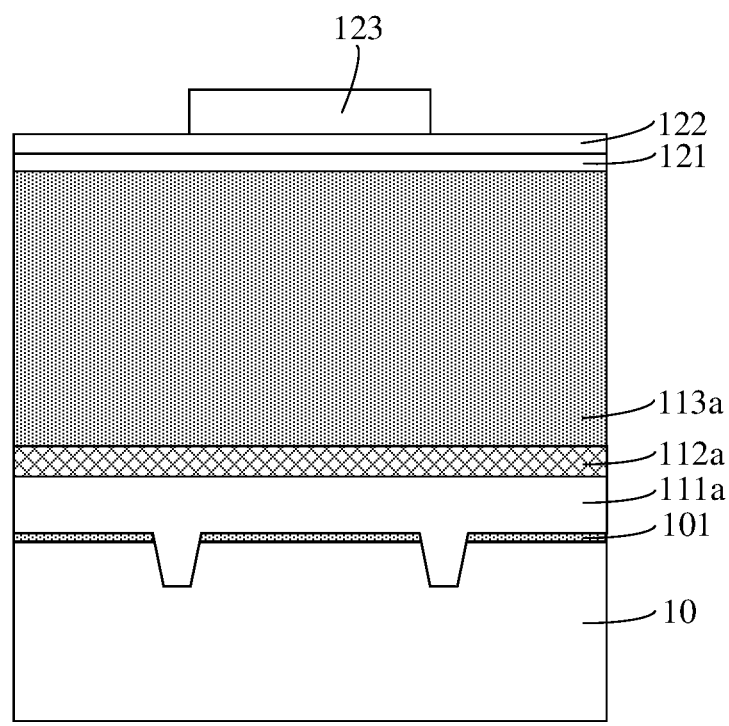
FIG. 1 to FIG. 18 are schematic structural diagrams corresponding to steps of a method for manufacturing a semiconductor structure provided in the embodiments of the present disclosure.

Referring to FIG. 1, it provides a substrate 10, and a bottom dielectric film 101, a first conductive film 111a, a second conductive film 112a, a top dielectric film 113a, a first mask layer 121, a second mask layer 122, and a third mask layer 123 which are stacked on the substrate 10 in sequence.

The bottom dielectric film 101 is configured to isolate the first conductive film 111a from an active region (not shown) in the substrate 10. A material of the bottom dielectric film 101 includes silicon nitride. Part of the first conductive film 111a is in contact with the active region to act as a bit line contact. A material of the first conductive film 111a includes polycrystalline silicon. A material of the second conductive film 112a includes tungsten. The top dielectric film 113a acts as the dielectric layer and protects the second conductive film 112a. A material of the top dielectric film 113a includes silicon nitride.

In the present embodiment, the mask layer includes the first mask layer 121 and the second mask layer 122. The hardness of the first mask layer 121 is greater than the hardness of the second mask layer 122, so as to improve the etching accuracy of the subsequent etching process. In other embodiments, there is an anti-reflection coating between the first mask layer and the first sacrificial film to reduce problems such as reflections and standing waves.

A material of the first mask layer 121 may include silicon nitride. A material of the second mask layer 122 may include polycrystalline silicon, and the anti-reflection coating is usually a carbon coating.

In the present embodiment, the third mask layer 123 is configured to define a position of a bit line structure subsequently formed.

Figure 2:
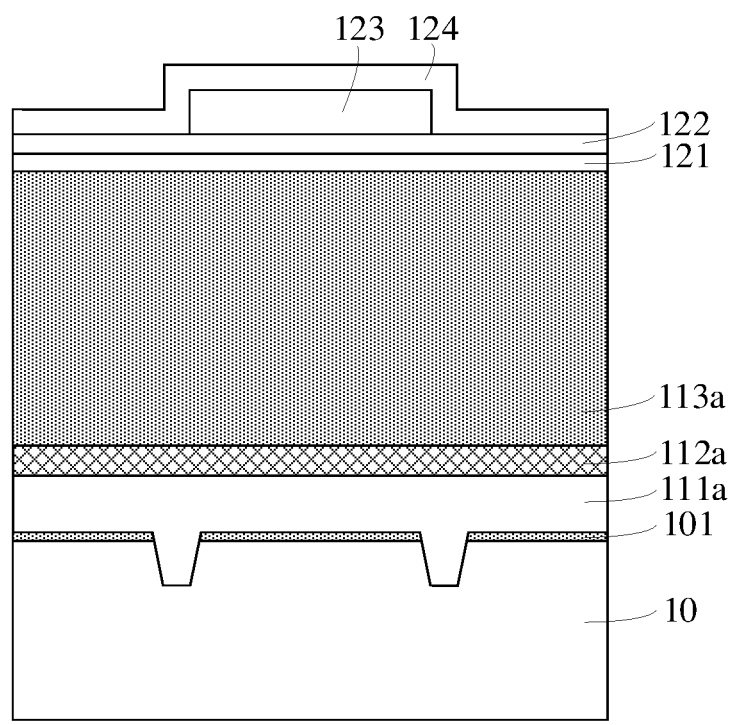

Referring to FIG. 2, it forms a fourth mask layer 124 covering a top surface and side walls of the third mask layer 123 and covering a top surface of the second mask layer 122. The fourth mask layer 124 is configured to define, in a direction parallel to the substrate 10, a width of the bit line structure subsequently formed.

Figure 3:
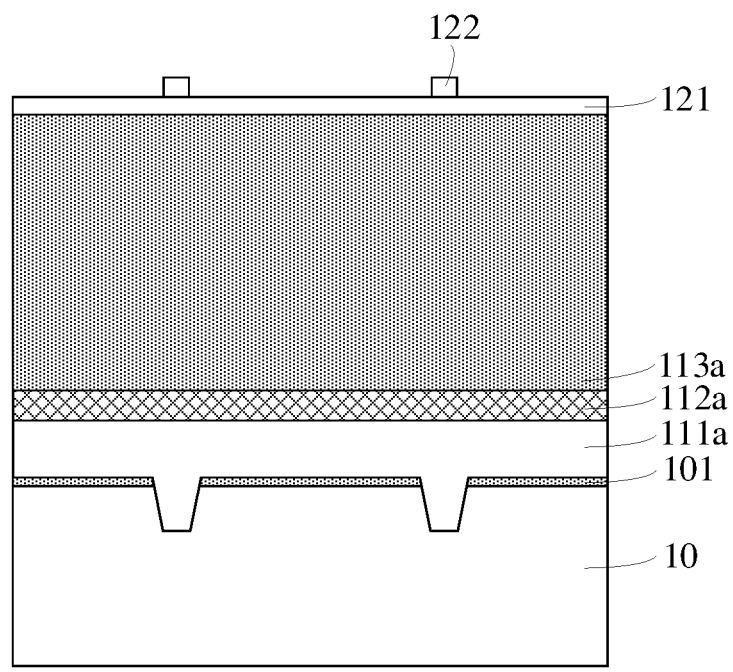

Referring to FIG. 3, the second mask layer 122 is etched using a Self-aligned Double Patterning (SADP) technology.

The width of the remaining second mask layer 122 is equal to the width of the fourth mask layer 124 (referring to FIG. 2) covering the side wall of the third mask layer 123 (referring to FIG. 2). The remaining second mask layer 122 serves as a mask for etching to form the bit line structure, and the width of the remaining second mask layer 122 is equal to the width of the bit line structure subsequently formed.

Figure 4:
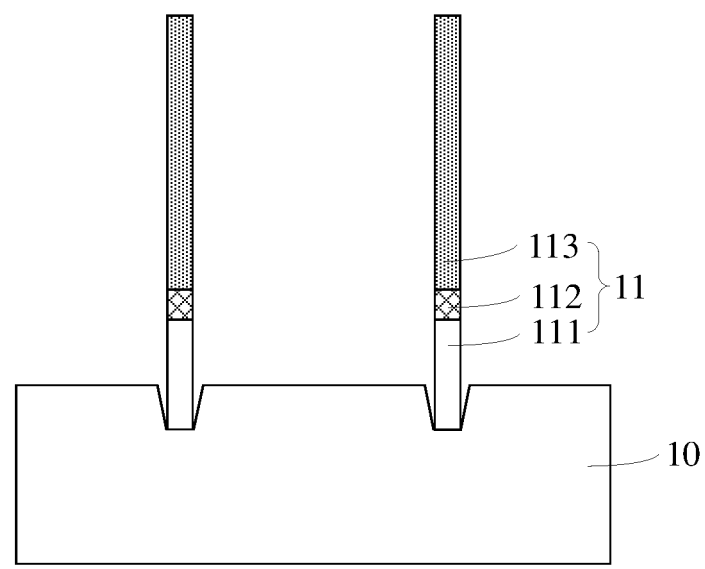

Referring to FIG. 4, the top dielectric film 113a, the second conductive film 112a, the first conductive film 111a, and the bottom dielectric film 101 (referring to FIG. 3) are etched through the remaining second mask layer 122 to form the bit line structure 11.

In the present embodiment, the bit line structure 11 includes an bottom dielectric layer (not shown), a conductive layer, and a top dielectric layer 113. The conductive layer includes a first conductive layer 111 and a second conductive layer 112. In other embodiments, the conductive layer may include a single layer or two or more conductive layers.

Figure 5:
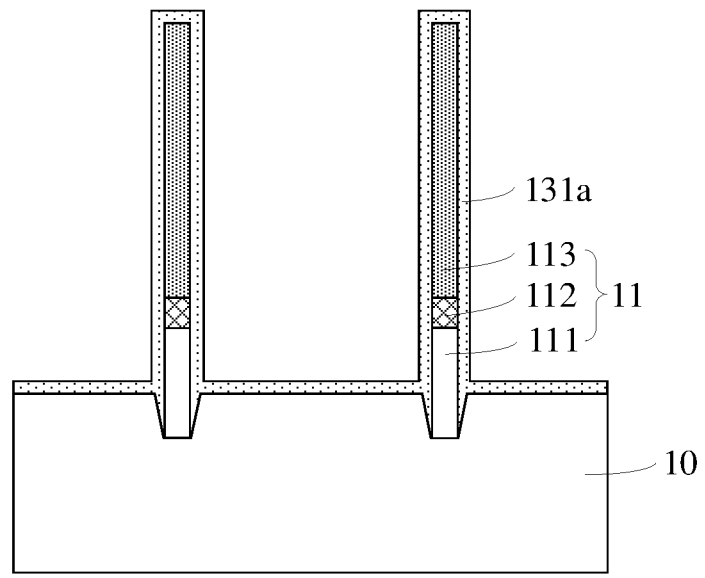
Figure 6:
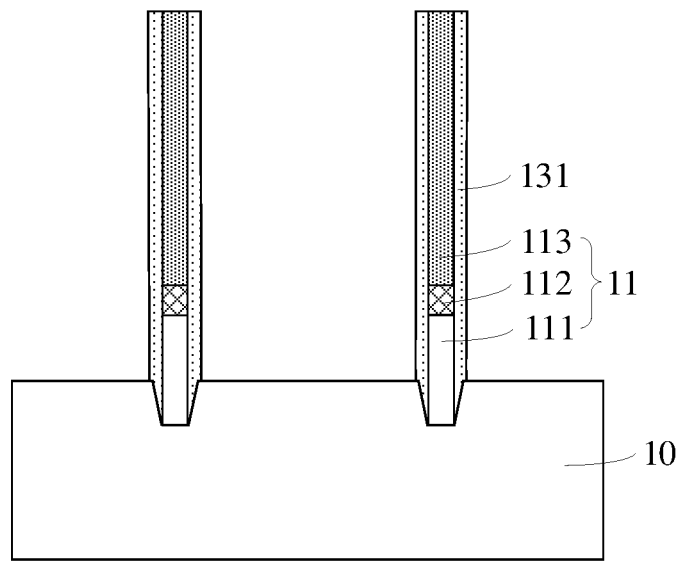

Referring to FIG. 5, it forms, by using a deposition process, a first sacrificial film 131a covering side walls and a top surface of the bit line structure 11 and a surface of the substrate 10. Referring to FIG. 6, it removes, by using a maskless dry etching process, part of the first sacrificial film 131a (referring to FIG. 5) covering the surface of the substrate 10 and the top surface of the bit line structure 11, and remaining part of the first sacrificial film 131a serves as a sacrificial side wall 131.

In the present embodiment, a material of the sacrificial side wall 131 is different from a material of the top dielectric layer 113, and the material of the sacrificial side wall 131 includes silicon dioxide.

Figure 7:
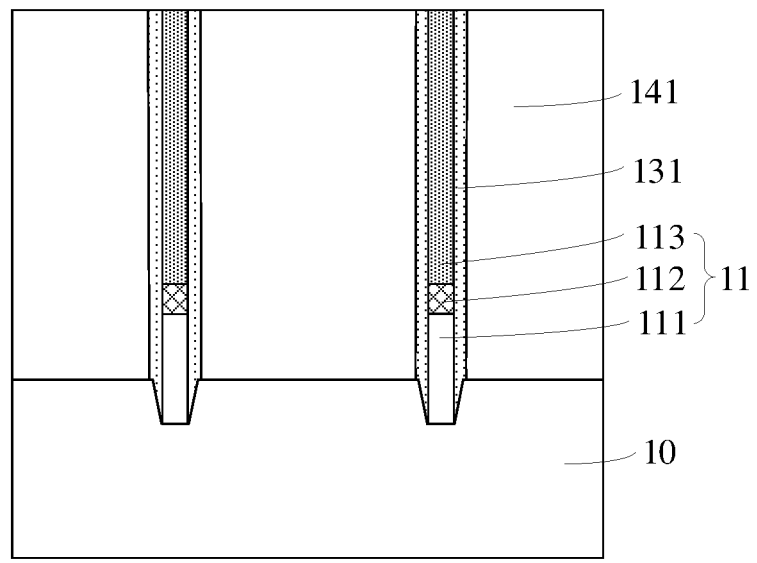

Referring to FIG. 7, before the top dielectric layer 113 is etched, a first sacrificial layer 141 filled between adjacent bit line structures 11 is formed. The first sacrificial layers 141 expose the top dielectric layer 113.

A material of the first sacrificial layer 141 is different from the material of the top dielectric layer 113, so as to be beneficial to avoid the substrate 10 from being damaged by the etching process for the top dielectric layer 113. Specifically, the material of the first sacrificial layer 141 includes exposed photoresist.

Figure 8:
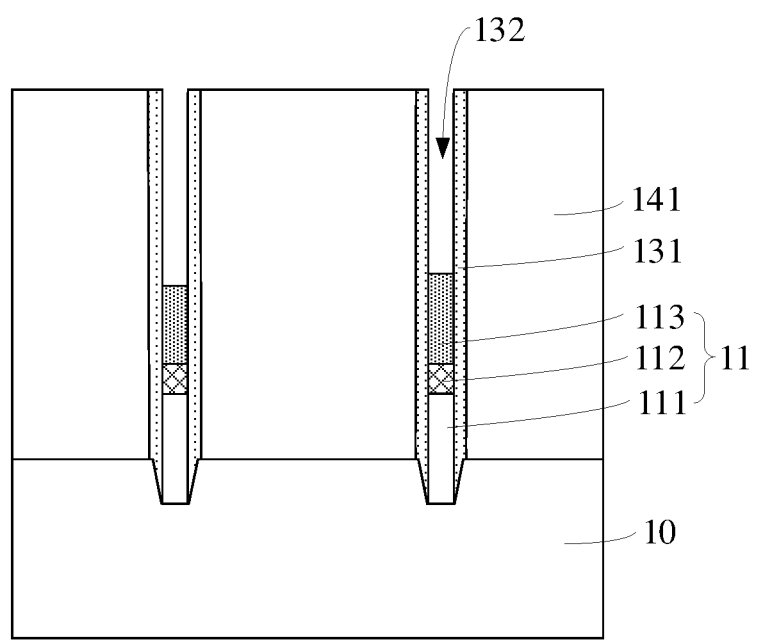

Referring to FIG. 8, the top dielectric layer 113 is etched to form a first gap 132 located between the opposite sacrificial side walls 131.

In the present embodiment, only part of the top dielectric layer 113 is etched out, and the top dielectric layer 113 with part of the thickness is retained, and the remaining top dielectric layer 113 is configured to protect the second conductive layer 112 of the bit line structure 11.

Figure 9:
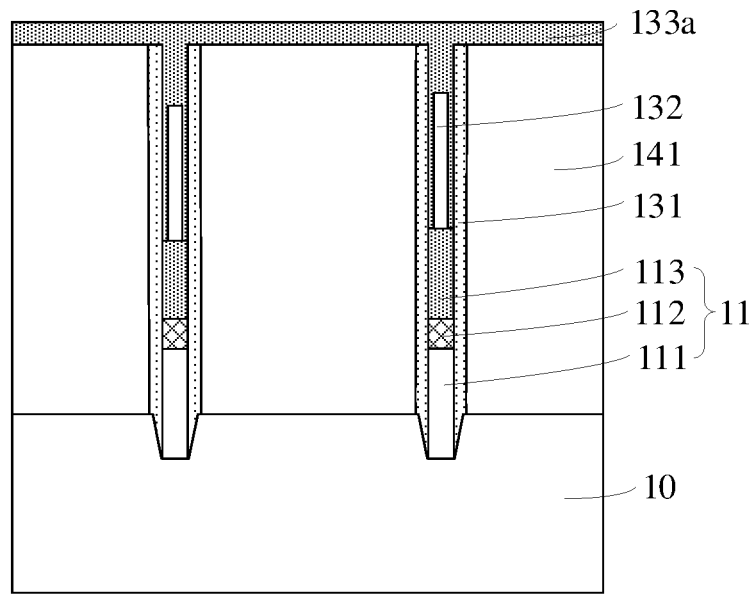
Figure 10:
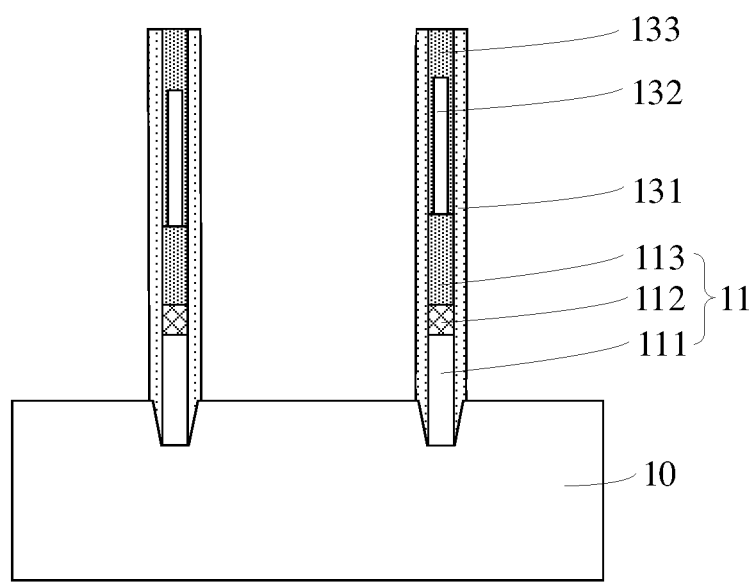

In the present embodiment, forming a gap isolation layer includes the following steps. Referring to FIG. 9, a single deposition process is performed to form a gap isolation film 133a that blocks the first gap 132. Referring to FIG. 10, a planarization process is performed on the gap isolation film 133a (referring to FIG. 9) so that a top surface of the gap isolation film 133a is flush with a top surface of the sacrificial side wall 131. The remaining gap isolation film 133a serves as a sacrificial isolation layer 133.

In other embodiments, forming the gap isolation layer includes the following steps. A first deposition process with a relatively low deposition rate is performed to form an enveloping layer covering the top surface of the top dielectric layer and the side walls of the sacrificial side walls. The first gap is provided inside the enveloping layer. A second deposition process with a relatively high deposition rate is then performed to achieve rapid sealing, that is, a first sealing layer that blocks a top opening of the first gap is formed. The first sealing layer and the enveloping layer constitute a gap isolation layer.

After the gap isolation layer 133 is formed, the first sacrificial layer 141 is removed (referring to FIG. 9) to expose the side walls of the sacrificial side walls 131 facing away from the bit line structure 11.

Figure 11:
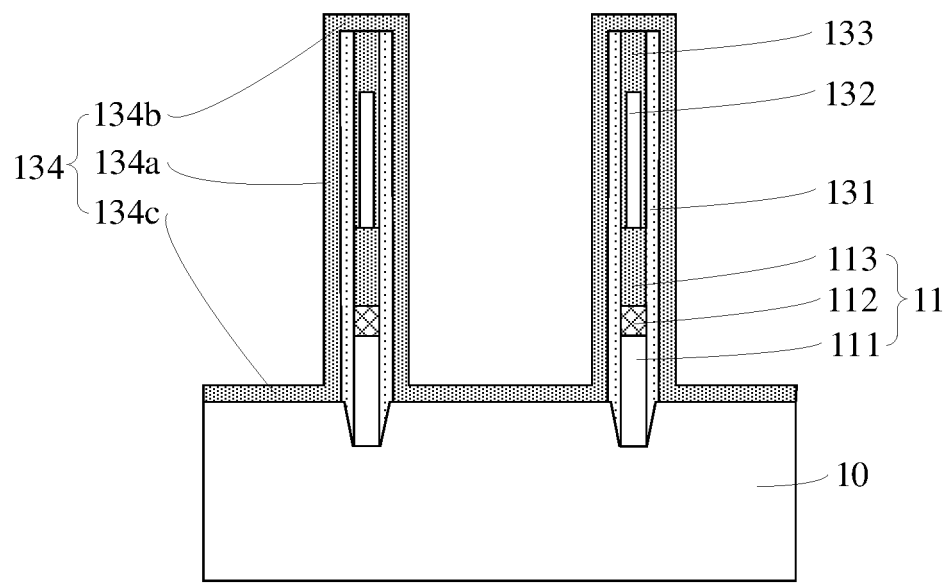

Referring to FIG. 11, a first isolation film 134 is formed using a deposition process.

In the present embodiment, the first isolation film 134 includes a top isolation layer 134b covering the top surfaces of the sacrificial side walls 131 and the top surface of the gap isolation layer 133, isolation side walls 134a covering the side walls of the sacrificial side walls 131, and a bottom isolation layer 134c covering the surface of the substrate 10.

Figure 12:
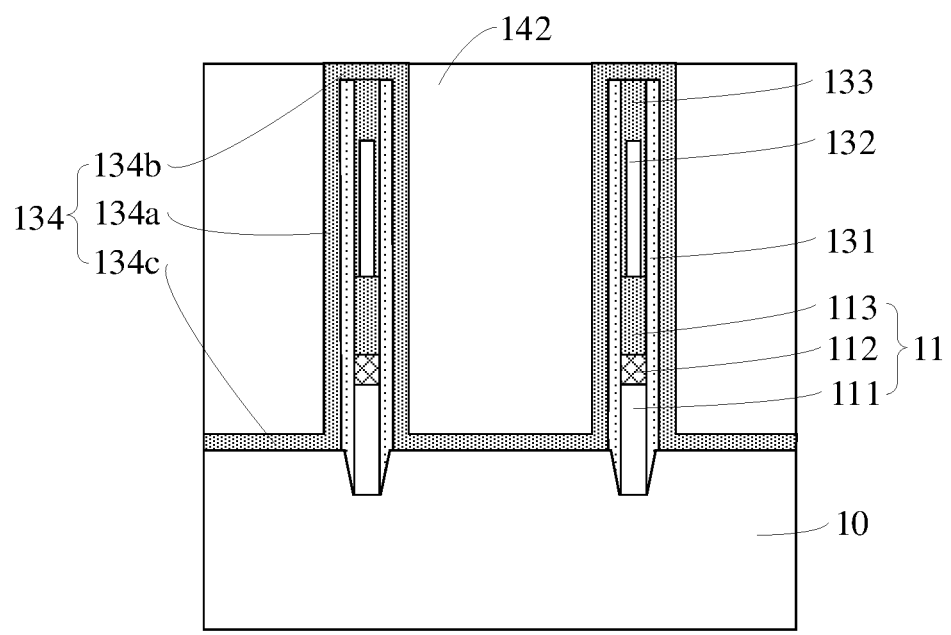

In the present embodiment, referring to FIG. 12, before removing the top isolation layer 134b by etching, a second sacrificial layer 142 filled between adjacent bit line structures 11 is formed to avoid the bottom isolation layer 134c from being etched through the etching process for the top isolation layer 134b and avoid the substrate 10 from being damaged. In other embodiments, no second sacrificial layer is formed after removing the top isolation layer by etching.

In the present embodiment, a material of the second sacrificial layer 142 includes exposed photoresist.

Figure 13:
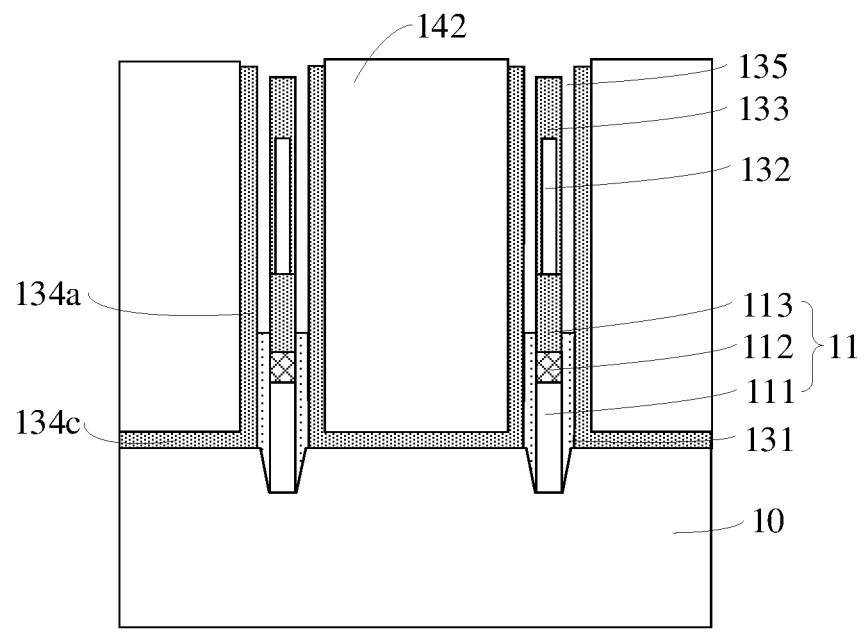

Referring to FIG. 13, the top isolation layer 134b (referring to FIG. 12) is removed, and at least part of the sacrificial side wall 131 is removed to form a second gap 135.

In the present embodiment, only part of the sacrificial side wall 131 is removed, and the remaining sacrificial side wall 131 covers the side walls of the first conductive layer 111 and the second conductive layer 112. In this way, it is not only beneficial to avoid the first conductive layer 111 and the second conductive layer 112 from being damaged by the process of removing the sacrificial side wall 131, but also beneficial to protect the first conductive layer 111 and the second conductive layer 112 and avoid signal transmission interruption caused by a locally collapsed material that damages the conductive layers to ensure that the whole semiconductor structure has relatively high signal transmission performance.

Figure 14:
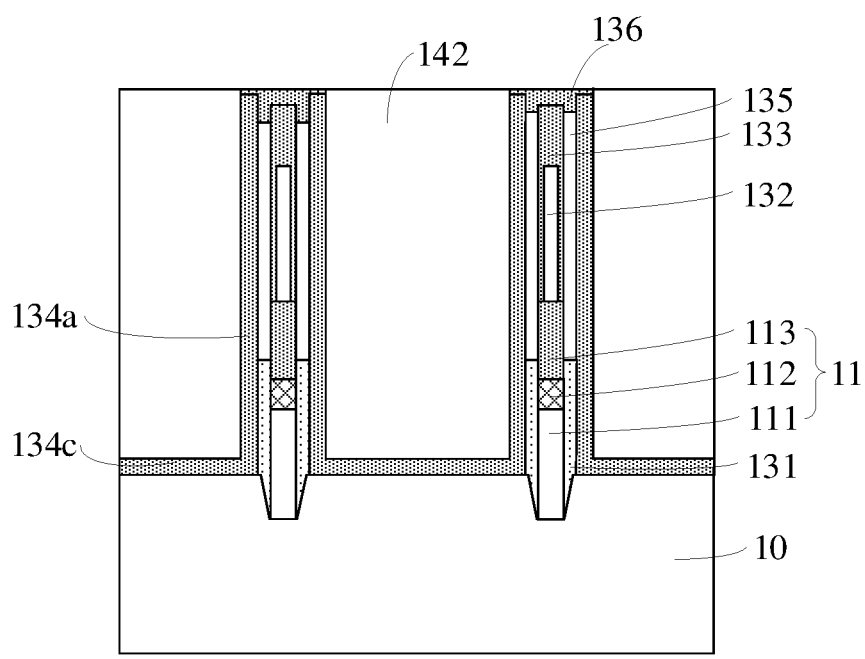

Referring to FIG. 14, a second sealing layer 136 that blocks a top opening of the second gap 135 is formed.

In the present embodiment, the top surface of the second sealing layer 136 is flush with the top surface of the second sacrificial layer 142, that is to say, the second sealing layer 136 is formed by the planarization process.

It should be noted that when a sealing layer that blocks a top opening of a certain gap is formed, if a width of the top opening of the gap is relatively large, in order to avoid collapse of the sealing layer due to inability of bearing its weight and to ensure rapid sealing to increase the size of the remaining gap, a relatively thin sealing layer will usually be formed. Then, although this type of sealing layer can bear its own weight, when other structures covering the sealing layer are too heavy, the sealing layer will collapse.

In the present embodiment, before the second sealing layer 136 is formed, a height difference between the top surface of the gap isolation layer 133 and the top surface of the isolation side wall 134a is adjusted so that the top surface of the gap isolation layer 133 is lower than the top surface of the isolation side wall 134a by a preset height. In this way, when the second sealing layer is deposited and formed subsequently, the gap isolation layer 133 can be used as a support to form a relatively thick second sealing layer 136, which is beneficial to avoid collapse of the second sealing layer 136 due to its own weight or due to the fact that the weight of a covering exceeds a pressure limit, and ensures that the semiconductor structure has relatively high structural stability.

Figure 15:
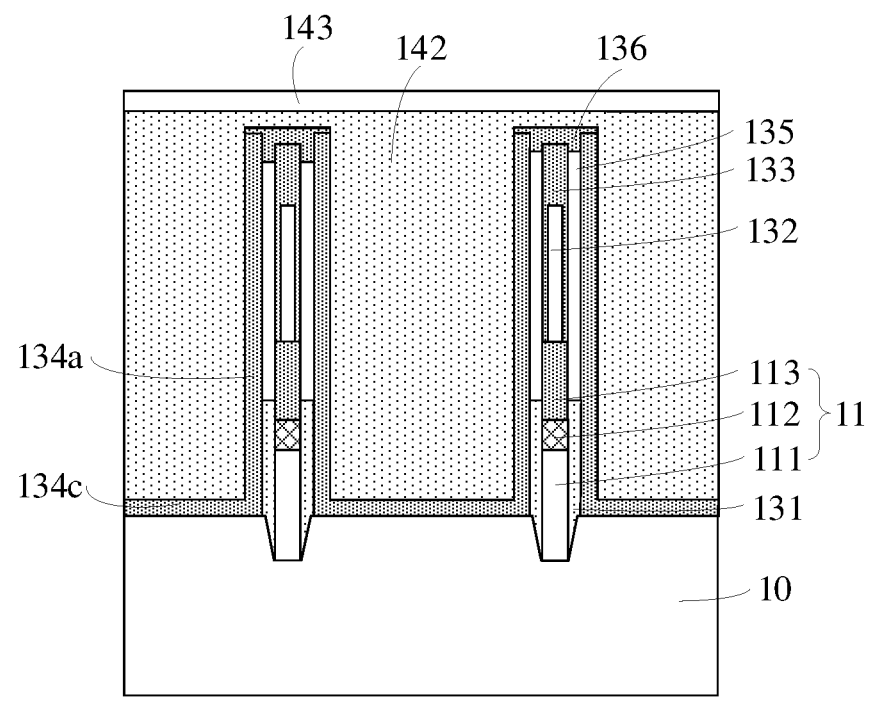
Figure 16:
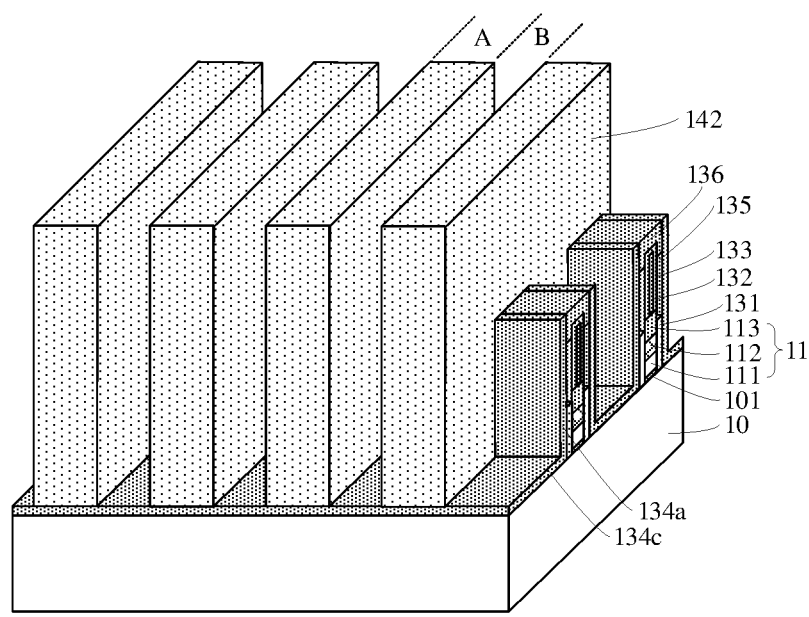

Referring to FIG. 15 and FIG. 16, a fifth mask layer 143 is formed, and a dry etching process is performed through the fifth mask layer 143.

In the present embodiment, in an extending direction parallel to the bit line structure 11, the substrate 10 may be divided into a first region A and a second region B which are arranged at an interval. The first region A between adjacent bit line structures 11 is configured to form a capacitor contact hole and fill a capacitor contact window. The second region B between adjacent bit line structures 11 is configured to form an isolation layer. The isolation layer is configured to divide the capacitor contact hole and isolate adjacent capacitor contact windows.

In the present embodiment, the fifth mask layer 143 covers the top surface of the second sacrificial layer 142 of the first region A, and exposes the top surface of the second sacrificial layer 142 of the second region B. Correspondingly, performing the dry etching process through the fifth mask layer 143 includes that the second sacrificial layer 142 of the second region B is removed.

In other embodiments, before the fifth mask layer is formed, a material of the second sacrificial layer is replaced. For example, a photoresist material is replaced with a silicon dioxide material.

Figure 17:
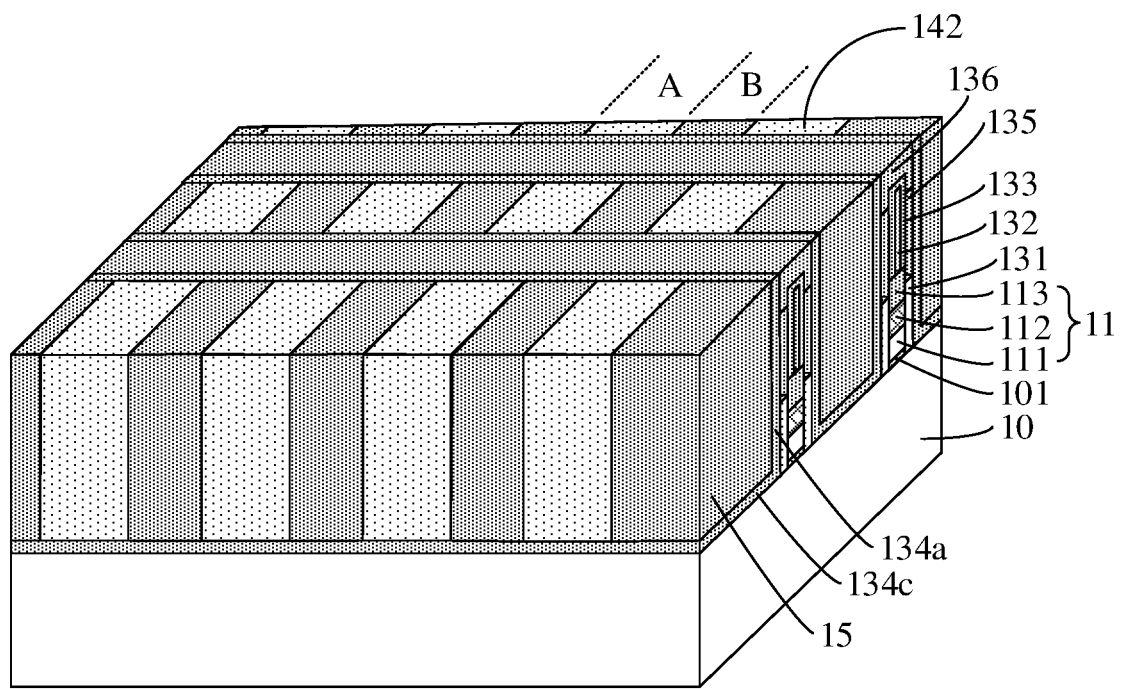

Referring to FIG. 17, a deposition process and a planarization process are performed.

In the present embodiment, the fifth mask layer 143 is removed before the deposition process is performed, so as to avoid that in the subsequent planarization process, a grinding device needs to be in contact with at least three materials (the material of the fifth mask layer 143, the material of the second sacrificial layer 142, and the material deposited by the deposition process), thus avoiding the influence of a concave-convex structure formed by a relatively large difference in removal rates of different materials on the grinding device to ensure relatively long service life of the grinding device. Alternatively, it increases the process efficiency by eliminating the need to replace grinding liquid or a mask component in the midway due to a large difference in the removal rates.

In other embodiments, the fifth mask layer is retained during the deposition, and the planarization process is subsequently used to simultaneously remove the fifth mask layer and other film layers. In this way, it is beneficial to reduce the process steps and shorten the process cycle.

In the present embodiment, the deposition process is configured to deposit an isolation material. The isolation material is configured to form a contact isolation layer 15. The contact isolation layer 15 is configured to isolate and define adjacent capacitor contact holes. Specifically, the contact isolation film with the top surface higher than the top surface of the second sealing layer 136 may be formed first. The planarization process is performed to the contact isolation film and the second sacrificial layer 142 to form the isolation layer 15 and the second sacrificial layer 142 which have the top surfaces flush with the top surface of the second sealing layer 136.

Figure 18:
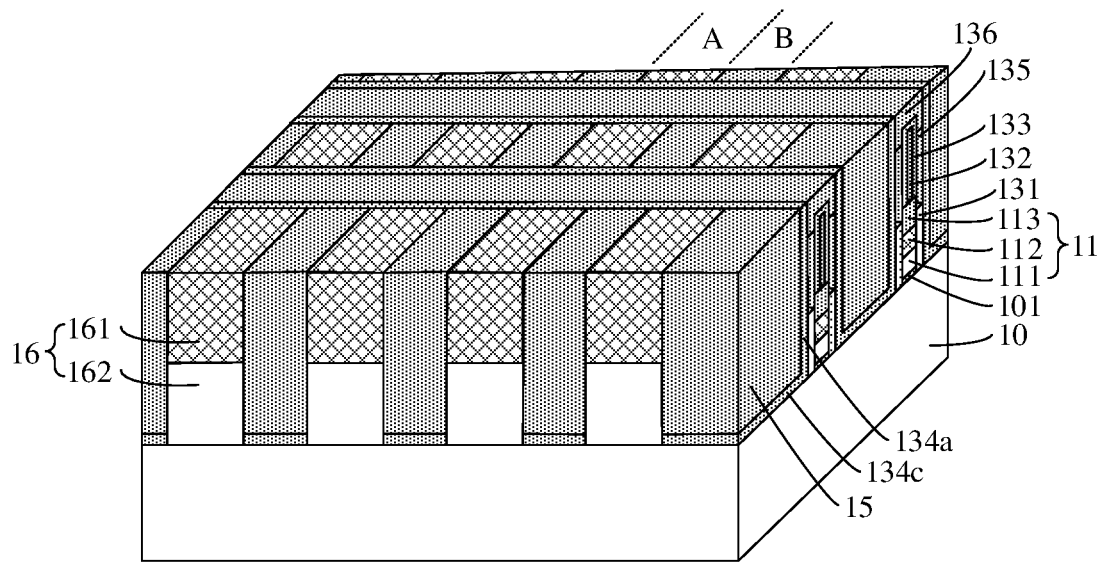

Referring to FIG. 18, the remaining second sacrificial layers 142 (referring to FIG. 17) in the first region A and the bottom isolation layer 134c between the second sacrificial layer 142 and the substrate 10 are etched to form capacitor contact holes (not shown). Each capacitor contact hole is filled to form a capacitor contact window 16. That is to say, a position of the capacitor contact hole is a position of the capacitor contact window 16.

In the present embodiment, the capacitor contact window 16 includes a first capacitor contact window 161 at the top and a second capacitor contact window 162 at the bottom. A contact resistance between the second capacitor contact window 162 and the substrate 10 is less than a contact resistance between the first capacitor contact window 161 and the substrate 10. In this way, it is beneficial to improve the signal transmission performance.

A material of the first capacitor contact window 161 includes tungsten, and a material of the second capacitor contact window 162 includes polycrystalline silicon.

In the present embodiment, a method for manufacturing a semiconductor structure is provided, the method can reduce the dielectric constant between the capacitor contact windows located on two opposite sides of the bit line structure, thereby reducing the parasitic capacitance between the opposite capacitor contact windows.

Correspondingly, the embodiments of the present disclosure also provide a semiconductor structure, which can be manufactured using the above-mentioned method for manufacturing a semiconductor structure.

Referring to FIG. 18, the semiconductor structure includes a substrate 10, a bit line structure 11 located on the substrate 10, capacitor contact holes (not shown) on each of two opposite sides of the bit line structure 11, and isolation side walls 134a. Each of the isolation side walls 134a is located between a respective bit line structure 11 and the capacitor contact holes on one side of the bit line structure. A gap isolation layer 133 is provided between the isolation side walls 134a located on the two opposite sides of the bit line structure 11. The gap isolation layer 133 is located on the bit line structure 11. A first gap 132 is provided inside the gap isolation layer 133. A second gap 135 is provided between the isolation side wall 134a and the gap isolation layer 133.

In the present embodiment, the second gap 135 is also located between the isolation side wall 134a and the bit line structure 11.

In the present embodiment, the semiconductor structure further includes sacrificial side wall 131. The sacrificial side wall 131 is located between the isolation side wall 134a and the bit line structure 11. The sacrificial side wall 131 covers a side wall of a conductive layer of the bit line structure 11, and the second gap 135 exposes a top surface of the sacrificial side wall 131.

In the present embodiment, a top surface of the gap isolation layer 133 is lower than the top surface of the isolation side wall 134a.

In the present embodiment, the first gap 132 and the second gap 135 extend in an extending direction parallel to the bit line structure 11.

In the present embodiment, in a direction perpendicular to the substrate 10, a thickness of the first gap 132 is less than or equal to 100 nm, for example, 85 nm, 90 nm, or 95 nm. In this way, it is beneficial to avoid structural collapse caused by the inability of the gap to provide a support, and to ensure that the semiconductor structure has better structural stability.

In the present embodiment, a new semiconductor structure is provided. A first gap is provided inside the gap isolation layer, and the second gap is provided between the gap isolation layer and the isolation side wall. The arrangement of the first gap and the second gap is beneficial to reduce parasitic capacitance between the opposite capacitor contact windows.

Those of ordinary skill in the art can understand that the above-mentioned implementations are specific embodiments for realizing the present disclosure, and in actual applications, various modifications can be made in form and details without departing from the spirit and scope of the present disclosure. Any person skilled in the art can make changes and modifications without departing from the spirit and scope of the present disclosure. Therefore, the scope of protection of the present disclosure shall be subject to the scope limited by the claims.

What is claimed is:

1. A semiconductor structure, comprising:
a substrate, bit line structures located on the substrate, and capacitor contact holes located on each of two opposite sides of the bit line structure;
isolation side walls, each of which is located between a respective bit line structure and the capacitor contact holes on one side of the bit line structure, wherein a gap isolation layer is provided between the isolation side walls located on two opposite sides of the bit line structure; the gap isolation layer is located on the bit line structure, and a first gap is provided inside the gap isolation layer; and a second gap is provided between one of the isolation side walls and the gap isolation layer; wherein
a top surface of the gap isolation layer is lower than a top surface of the isolation side wall.

2. The semiconductor structure of claim 1, wherein the second gap is also located between the isolation side wall and the bit line structure.

3. The semiconductor structure of claim 1, further comprising:
a sacrificial side wall located between the isolation side wall and the bit line structure, wherein the sacrificial side wall covers a side wall of a conductive layer of the bit line structure; and the second gap exposes a top surface of the sacrificial side wall.

4. The semiconductor structure of claim 1, wherein the first gap and the second gap extend in an extending direction parallel to the bit line structure.

5. The semiconductor structure of claim 1, wherein in a direction perpendicular to a surface of the substrate, a thickness of the first gap is less than or equal to 100 nm.

6. A method for manufacturing a semiconductor structure, comprising:
providing a substrate and bit line structures located on the substrate, wherein each of the bit line structures comprises a top dielectric layer, and is provided with capacitor contact holes in each of two opposite sides of the bit line structure;
forming a sacrificial side wall covering a side wall of the top dielectric layer;
removing at least part of the top dielectric layer to form a first gap;
performing a deposition process to form a gap isolation layer with the first gap; and
forming an isolation side wall covering the sacrificial side wall, and removing at least part of the sacrificial side wall to form a second gap located between the isolation side wall and the gap isolation layer;
wherein
a top surface of the gap isolation layer is lower than a top surface of the isolation side wall;
and
after the second gap is formed, a second sealing layer that blocks a top opening of the second gap is formed; and the second sealing layer covers the top surface of the gap isolation layer.

7. The method for manufacturing a semiconductor structure of claim 6, wherein
forming the gap isolation layer comprises: forming an enveloping layer covering the top surface of the top dielectric layer and a side wall of the sacrificial side wall, wherein the first gap is provided inside the enveloping layer; and forming a first sealing layer that blocks a top opening of the first gap, wherein the first sealing layer and the enveloping layer constitute the gap isolation layer.

8. The method for manufacturing a semiconductor structure of claim 7, wherein
a deposition rate for forming the first sealing layer is greater than a deposition rate for forming the enveloping layer.

9. The method for manufacturing a semiconductor structure of claim 6, wherein
removing at least part of the sacrificial side wall comprises: removing part of the sacrificial side wall, wherein remaining part of the sacrificial side wall covers a side wall of a conductive layer of the bit line structure.

10. The method for manufacturing a semiconductor structure of claim 6, wherein
providing the bit line structures located on the substrate comprises:
providing, on the substrate, a bottom dielectric film, a first conductive film, a second conductive film, a top dielectric film, a first mask layer, a second mask layer and a third mask layer;
partially etching the second mask layer; and
etching the top dielectric film, the second conductive film, the first conductive film and the bottom dielectric film through the partially etched second mask layer to form the bit line structures.

11. The method for manufacturing a semiconductor structure of claim 10, wherein
a hardness of the first mask layer is greater than a hardness of the second mask layer.

12. The method for manufacturing a semiconductor structure of claim 10, wherein
the third mask layer is configured to define positions of the bit line structures.

13. The method for manufacturing a semiconductor structure of claim 12, wherein
providing the bit line structures located on the substrate further comprises:
forming a fourth mask layer covering a top surface and side walls of the third mask layer and covering a top surface of the second mask layer to define, in a direction parallel to the substrate, a width of each bit line structure.

* * * * *